United States Patent [19]

Doehler et al.

[11] 4,438,724
[45] Mar. 27, 1984

[54] GROOVED GAS GATE

[75] Inventors: Joachim Doehler, Union Lake; David A. Gattuso, Pontiac; Kevin R. Hoffman, Sterling Heights, all of Mich.

[73] Assignee: Energy Conversion Devices, Inc., Troy, Mich.

[21] Appl. No.: 407,983

[22] Filed: Aug. 13, 1982

[51] Int. Cl.³ .............................................. C23C 13/10
[52] U.S. Cl. .................................. 118/719; 118/718; 118/733; 226/97; 34/242; 227/3
[58] Field of Search ............... 118/718, 719, 729, 733; 414/217, 292; 34/242; 277/3, 53, 80; 226/7, 97

[56] References Cited

U.S. PATENT DOCUMENTS 4,065,137  12/1977  Rueggeberg et al. ............... 277/3 X
4,354,686  10/1982  Imanishi et al. ......................... 277/3

FOREIGN PATENT DOCUMENTS 2831710  10/1979  Fed. Rep. of Germany ...... 118/718
2008162   5/1979  United Kingdom ................ 118/733
2071232   9/1981  United Kingdom .................... 277/3

Primary Examiner—John D. Smith
Assistant Examiner—Bernard F. Plantz
Attorney, Agent, or Firm—Marvin S. Siskind

[57] ABSTRACT

A grooved passageway surface in a magnetic gas gate, the gas gate adapted to operatively connect two adjacent chambers, in the first chamber of which process gases are introduced for depositing a first layer upon a magnetic substrate and in the second chamber of which process gases are introduced for depositing a second layer atop the first layer. Since it is important to prevent the second chamber gases from contaminating the first chamber gases, a constant pressure differential established between the chambers is employed to provide a substantially unidirectional flow of gases from the first chamber into the second chamber. Magnetic gas gates have been used in the prior art to reduce the size of gas gate passageways by creating a magnetic field which urges the unlayered surface of the substrate toward a wall of the passageway. Although, thereby reducing the size of the passageway opening and correspondingly reducing the back diffusion of gases from the second chamber, the passageway is simultaneously divided into a relatively large flow channel and a relatively narrow flow channel. The present invention is concerned with reducing the back diffusion of gases through the relatively narrow flow channel. This is accomplished by forming a plurality of elongated grooves in the passageway wall toward which the unlayered surface of the substrate is urged. The grooves are substantially coextensive with the length of the passageway so as to operatively interconnect the adjacent chambers. The flow channels thus established are able to accommodate a sufficient flow rate of process gases to further reduce the back diffusion of process gases.

3 Claims, 7 Drawing Figures

GROOVED GAS GATE

FIELD OF THE INVENTION

This invention relates generally to gas gates adapted to operatively connect a pair of isolated deposition chambers for the production of photovoltaic devices and more particularly to an improved magnetic gas gate having a passageway provided with a plurality of longitudinally extending grooves for decreasing contamination of one deposition chamber caused by the back diffusion of gases from the adjacent deposition chamber.

BACKGROUND OF THE INVENTION

This invention relates to apparatus for continuously producing photovoltaic devices on a web of magnetic substrate material by depositing successive amorphous silicon alloy semiconductor layers in each of at least two adjacent deposition chambers. The composition of each amorphous layer is dependent upon the particular process gases introduced into each of the deposition chambers. The gases introduced into the first deposition chamber are carefully controlled and isolated from the gases introduced into the adjacent deposition chamber. More particularly, the deposition chambers are operatively connected by a relatively narrow gas gate passageway (1) through which the web of substrate material passes; and (2) adapted to isolate the process gases introduced into the first chamber from the process gases introduced into the adjacent deposition chamber. As disclosed in U.S. patent application Ser. No. 372,937, filed Apr. 29, 1982, and entitled "Magnetic Gas Gate," it has been determined that despite the relatively small size of the gas gate passageway, dopant gases introduced into one chamber back diffuse into the adjacent chamber, thereby contaminating the layer deposited in said adjacent chamber. The "Magnetic Gas Gate" application disclosed apparatus (namely magnets positioned above the passageway opening for urging the magnetic substrate upwardly) by which the height of the passageway opening in the gas gate could be reduced. The reduction in the height of the passageway opening correspondingly reduced the back diffusion of dopant gases for the same flow rates, thereby decreasing the contamination of the layer deposited in the intrinsic deposition chamber. However, it has been determined that when the web of substrate material is urged by the magnets against the upper wall of the gas gate passageway, the passageway is divided by the web of substrate material into a relatively wide lower slit and a relatively narrow upper slit. (For purposes of the instant application the term "slit" shall be defined as the spacing, however irregular it may be, between the upper surface of the substrate and the upper wall of the gas gate passageway.) The process gases, being inherently viscous (and especially viscous at the elevated deposition temperatures), are unable to travel through the narrow upper slit with sufficient velocity to prevent back diffusion of process gases from the dopant deposition chamber into the adjacent intrinsic deposition chamber. It is to the end of decreasing the back diffusion of process gases through the narrow upper slit, between the unlayered surface of the web of substrate material and the wall of the passageway opening, that the present invention is directed.

Recently, considerable efforts have been made to develop processes for depositing amorphous semiconductor alloys, each of which can encompass relatively large areas, and which can be doped to form p-type and n-type materials for the production of p-i-n-type devices which are, in operation, substantially equivalent to their crystalline counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films wherein silane ($SiH_4$) gas is passed through a reaction tube where the gas is decomposed by a radio frequency (r.f.) glow discharge and deposited on a substrate at a substrate temperature of about 500–600 degrees K. (227–327 degrees C.). The material so deposited on the substrate is an intrinsic amorphous material consisting of silicon and hydrogen. To produce a doped amorphous material, phosphine gas ($PH_3$), for n-type conduction, or diborane ($B_2H_6$) gas, for p-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to reduce the density of the localized states in the energy gap.

It is now possible to prepare greatly improved amorphous silicon alloys, that have significantly reduced concentrations of localized states in the energy gaps thereof, while providing high quality electronic properties by glow discharge. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Sanford R. Ovshinsky and Masatsugu Izu, which issued on Aug. 12, 1980, under the same title. As disclosed in these patents, fluorine introduced into the amorphous silicon semiconductor operates to substantially reduce the density of the localized states therein and facilitates the addition of other alloying materials, such as germanium.

Activated fluorine readily diffuses into, and bonds to, amorphous silicon in a matrix body to substantially decrease the density of localized defect states therein. This is because the small size of the fluorine atoms enables them to be readily introduced into an amorphous silicon matrix. The fluorine bonds to the dangling bonds of the silicon and forms a partially ionic stable bond with flexible bonding angles, which results in a more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and having highest electronegativity.

Compensation may be achieved with fluorine, alone or in combination with hydrogen, upon the addition of such element(s) in very small quantities (e.g., fractions of one atomic percent). However, the amounts of fluorine and hydrogen most desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defect states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is an organizer of local structure in the silicon-containing alloy through inductive and ionic effects. Fluorine, also influences the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is increased without substantially decreasing the short circuit current.

Many publications on crystalline stacked cells following Jackson have been reported and, more recently, several articles dealing with Si-H materials in stacked cells have been published. Marfaing proposed utilizing silane deposited amorphous Si-Ge alloys in stacked cells, but did not report the feasibility of doing so. (Y. Marfaing, Proc. 2nd European) Communities Photovoltaic Solar Energy Conf., Berlin, West Germany, p. 287, (1979).

Hamakawa et al., reported the feasibility of utilizing Si-H in a configuration which will be defined herein as a cascade type multiple cell. The cascade cell is hereinafter referred to as a multiple cell without a separation or insulating layer therebetween. Each of the cells was made of an Si-H material of the same band gap in a p-i-n junction configuration. Matching of the short circuit current ($J_{sc}$) was attempted by increasing the thickness of the cells in the serial light path. As expected, the overall device Voc. increased and was proportional to the number of cells.

Due to the beneficial properties attained by the introduction of fluorine, amorphous alloys used to produce cascade type multiple cells now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell alloy mantains high electronic qualitites and photoconductivity when the adjusting element(s) are added to tailor the device wavelength characteristics for a specific photoresponse application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce photovoltaic devices. Unlike crystalline silicon which is limited to batch processing for the manufacture of solar cells, amorphous silicion alloys can be deposited in multiple layers over large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the back diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material. The gas gate disclosed in previously mentioned patent application Ser. No. 372,937 contemplated the creation of a plurality of magnetic fields adapted to urge the magnetic web of substrate material against a wall of the passageway opening so that the height of the passageway opening could be reduced. The reduced width of the opening correspondingly decreased the amount of process gas which back diffused from the dopant deposition chambers to the intrinsic deposition chamber without correspondingly increasing the risk that amorphous layers, deposited on the substrate, would contact a passageway wall.

While the magnetic gas gate of patent application Ser. No. 372,937 reduced the height of the gas gate passageway opening, and thereby reduced the levels of contamination previously encountered, it simultaneously divided the passageway opening into a relatively wide lower slit and a relatively narrow upper slit. The velocity of the inert sweep gases and residual process gases traveling through the wide lower slit is sufficiently great to substantially prevent the back diffusion of process gases from the dopant deposition chamber to the intrinsic chamber. However, due to the fact that the sweep gases employed in the deposition apparatus are viscous, which viscosity becomes more pronounced at the elevated temperatures required by the apparatus to deposit amorphous semiconductor layers onto the substrate, the drag on the sweep gases along the passageway wall and the unlayered surface of the substrate which define the relatively narrow upper slit results in a relatively low velocity flow therethrough. Accordingly, the process gases from the dopant chamber are able to back diffuse into the intrinsic chamber through the narrow upper slit.

Referring now to the drawing of FIG. 6, the parabola referenced by the alphabetical character A indicates the velocity profile of the gases flowing from the intrinsic chamber to the dopant chamber through the relatively large lower passageway slit 84, while the alphabetical character B indicates the velocity profile of the gases flowing from the intrinsic chamber to the dopant chamber through the relatively narrow upper passageway slit 82. By comparing the two velocity profiles, it is readily apparent that the velocity of the gases flowing through the lower, relatively large passageway slit, is far greater than the velocity through the upper, relatively narrow passageway slit. Further, since the narrow upper slit is caused by random warping and canoeing of the thin substrate material, the degree of contamination fluctuates with time, resulting in nonuniform semiconductor layers.

At this point is it necessary to discuss pressure differential relative to the back diffusion of gases between the adjacent deposition chambers operatively connected by the gas gate. FIG. 7 is a graph of the number of atoms of a gas per second (dn/dt) flowing through a narrow opening as a function of the size of that opening (in this case "a" indicates the gas gate passageway opening), assuming a constant pressure differential is maintained on both ends of the opening. As the size of "a" is increased, the volume of gases flowing therethrough in order to maintain the constant pressure differential must correspondingly increase. Therefore, the velocity must correspondingly increase. This represents a desirable characteristic because the greater the velocity of process gases flowing from the intrinsic deposition chamber to the dopant deposition chamber, the more difficult it becomes for dopant gases to back diffuse from the dopant deposition chamber to the intrinsic chamber. The functional dependency of back diffusion, dn/dt, relative to the size of the gas gate passageway opening "a" is represented by the equation $(a)(e^{-a^2})$. That functional dependency, as evidenced by the amount of back diffusion, reaches a maximum when "a" is about 200 microns or about 10 mils. This point is indicated by the alphabetical character C on the graph of FIG. 7. It is therefore essential that both, the size of the slits above, as well as below, the web of substrate material be greater than the 200 micron level at which maximum back diffusion occurs. Obviously, the size of the slits should be substantially greater than 200 microns so that back diffusion is minimized. There is no problem in creating a sufficiently large opening below the web of substrate material since said substrate is magnetically urged toward the upper wall of the passageway opening. The focus of the present invention is decreasing back diffusion in the narrow opening above the web of substrate material, the size of which has been found in prior art devices to approach the 200 micron "danger point."

The problem of back diffusion is solved in the present invention by providing a plurality of elongated grooves (extending the entire, approximately eight inch, length of the passageway opening) from the dopant deposition chamber to the adjacent intrinsic deposition chamber in the wall of the passageway opening above the web of substrate material. In this manner, a plurality of spaced, relatively high flow channels are provided in the space between the unlayered surface of the web of substrate material and the upper wall of the passageway opening. Because the channels are relatively high, the sweep gases and residual process gases are adapted to unidirectionally flow therethrough at substantial velocities despite the drag incurred as said gases contact the passageway wall and the substrate surface. Although relatively narrow slits still exist between adjacent high velocity flow channels established by the elongated grooves, it is much more probable for molecules of dopant process gases to enter the high velocity channels during their traverse of the eight inch long passageway separating the dopant chamber from the intrinsic chamber, than to have those molecules remain in the narrow slit between the high velocity flow channels for that eight inch long trip. By substantially reducing the amount of back diffusion from the dopant deposition chamber to the intrinsic deposition chamber, the production of a more efficient photovoltaic device is accomplished.

Although the foregoing discussion dealt with a single dopant deposition chamber and an adjacent intrinsic deposition chamber, it should be apparent that other deposition chambers may be operatively connected by the gas gates of the present invention. For example, a p-type deposition chamber may be connected on one side of the intrinsic deposition chamber and an n-type deposition chamber may be connected on the other side of the intrinsic deposition chamber so as to produce a p-i-n-type semiconductor device. Alternatively, a plurality of these triads of deposition chambers could be interconnected to produce a plurality of p-i-n-type cells. Similarly, a chamber in which the transparent conductive oxide layer (discussed hereinafter) is added atop the uppermost amorphous semiconductor alloy layer may be operatively connected by the instant gas gates to the final deposition chamber. Since it would be undesirable to have constituents introduced into the transparent conductive oxide (TCO) chamber back diffused into the dopant deposition chamber, the grooved gas gate of the present invention would be employed between the TCO chamber and the final dopant deposition chamber. For that matter, the grooved gas gate of the present invention is applicable between all chambers of the continuous production apparatus so as to produce amorphous photovoltaic devices of high quality.

The many objects and advantages of the present invention will become clear from the drawings, the detailed description of the invention and the claims which follow.

BRIEF SUMMARY OF THE INVENTION

Disclosed herein is a grooved, magnetic gas gate for reducing, through the narrow slit which is formed between the unlayered surface of the web of substrate material and the corresponding wall of the gas gate passageway, the back diffusion of process gas constituents from one of a pair of adjacent isolated deposition chambers to the other of the pair. The gas gate includes a relatively narrow passageway through which a substrate moves from the first of the adjacent deposition chambers wherein a first amorphous semiconductor layer is deposited onto one surface thereof to the second of said deposition chambers wherein a second amorphous semiconductor layer is deposited atop the first layer. The intrinsic deposition chamber includes a first conduit through which at least one process gas is introduced and the dopant deposition chamber includes a conduit through which at least one additional process gas, not introduced into the intrinsic deposition chamber, is introduced. The intrinsic deposition chamber is further provided with a second conduit at the entrance of the gas gate passageway for introducing an inert gas. The inert gas is adapted to be swept through the gas gate passageway at a sufficient velocity to substantially prevent the back diffusion of gases from the dopant deposition chamber to the intrinsic deposition chamber by maintaining a constant pressure differential on opposite sides of the gas gate passageway.

A magnetic gas gate is typically adapted to magnetically urge the unlayered surface of the magnetic substrate traveling through the passageway opening thereof toward the corresponding wall of that passageway opening. In this manner, the distance between the passageway walls may be decreased without simultaneously having the semiconductor alloy layers deposited on the substrate surface scrape against and be removed by a passageway wall. However, the magnetic gas gates divided the passageway opening into an upper relatively narrow slit and a lower relatively wide slit. And although, there is an overall reduction in the back diffusion of process gas from the dopant deposition chamber into the intrinsic deposition chamber through the relatively wide slit of the gas gate passageway, back diffusion of dopant gases occurred at an undesirable rate in the relatively narrow slit of the gas gate passageway. In the present invention, a plurality of spaced grooves are formed in that passageway wall toward which the unlayered surface of the substrate is urged. The grooves extend the entire length of the passageway opening so as to operatively interconnect the dopant deposition chamber and the intrinsic deposition chamber. The grooves have been found to substantially reduce the back diffusion of process gases between adjacent chambers by providing a sufficiently large flow channel in the relatively narrow portion of the gas gate passageway to prevent the drag caused by the viscous gases contacting the walls which define the relatively narrow passageway slit from substantially reducing the rate of flow of process gases therethrough.

DETAILED DESCRIPTION OF THE DRAWINGS

I. The Photovoltaic Cell

Figure 1:
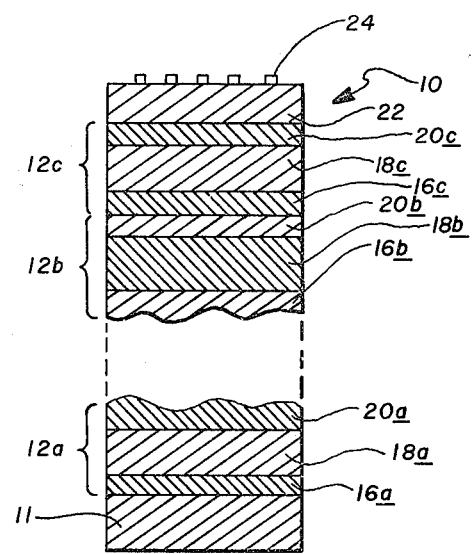
FIG. 1 is a fragmentary, cross-sectional view of a tandem or cascade photovoltaic device comprising a plurality of p-i-n-type cells, each layer of the cells formed from an amorphous, semiconductor alloy in accordance with the principles of the present invention.

Referring now to the drawings and particularly to FIG. 1, a tandem or cascade-type photovoltaic cell, formed of successive p-i-n layers each including an amorphous semiconductor alloy, is shown generally by the numberal 10. It is for the production of this type of photovoltaic device, wherein amorphous alloy layers are continuously deposited onto a moving web of substrate material in successive isolated deposition chambers, that the improved gas gates of the present invention were developed.

More particularly, FIG. 1 shows a p-i-n-type photovoltaic device such as a solar cell made up of individual p-i-n-type cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous material, for purposes of this application, the term "substrate" shall include not only a flexible film, but also any elements added thereto by preliminary processing. Most commonly the substrate material 11 may be stainless steel, aluminum, tantalum, molybdenum or chrome.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, the gas gates of this invention are equally adapted for use in multiple chamber apparatus which is adapted to produce tandem n-i-p cells by simply reversing the order of depositing the n-type and p-type layers onto the substrate.

For each of the cells 12a, 12b and 12c, the p-type layers are characterized by light absorptive, high conductivity alloy layers. The intrinsic alloy layers are characterized by an adjusted wavelength threshold for solar photoresponse, high light absorption, low dark conductivity and high photoconductivity, including sufficient amounts of a band gap adjusting element or elements to optimize the band gap for the particular cell application.

It is to be understood that following the deposition of the semi-conductor alloy layers, a further deposition step may be either performed in a separate environment or as a part of the continuous production apparatus. In this step, a TCO (transparent conductive oxide) layer 22 is added, which layer may, for example, be indium tin oxide (ITO), cadmium stannate ($Cd_2SnO_4$), or doped tin oxide ($SnO_2$). Although an electrode grid 24 may be added to the device, for a tandem cell having a sufficiently small area, the TCO layer 22 is generally sufficiently conductive so the grid 24 is not necessary. If the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Glow Discharge Deposition Chambers

Figure 2:
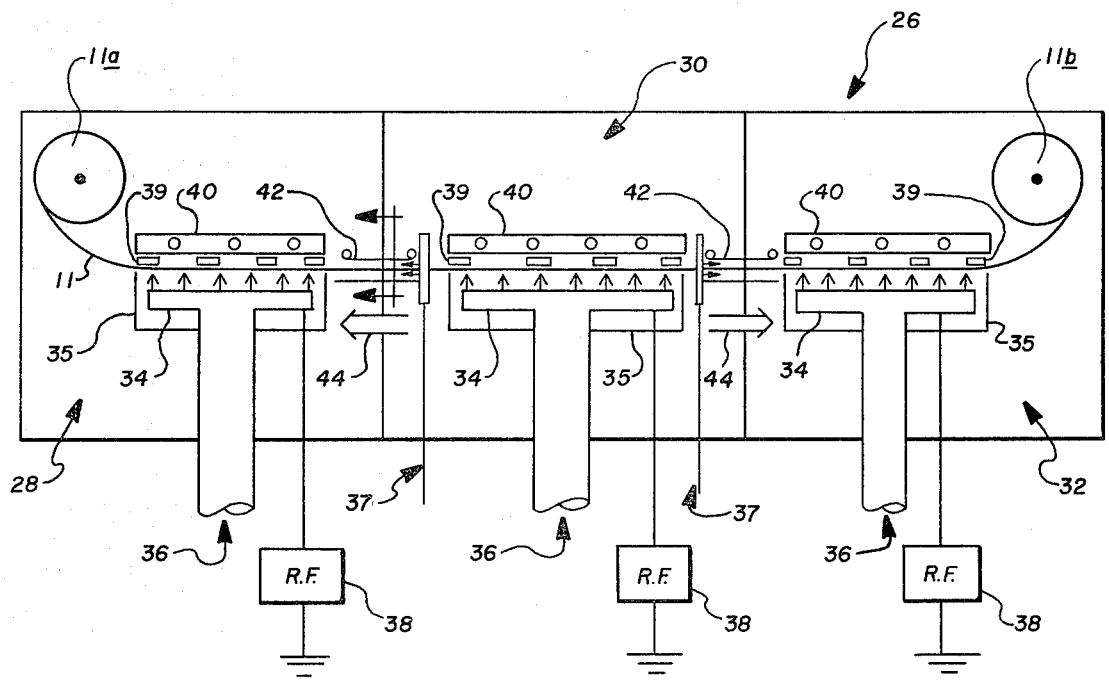
FIG. 2 is a diagrammatic representation of a multiple glow discharge chamber deposition system adapted for the continuous production of the photovoltaic devices shown in FIG. 1, which system includes gas gates for substantially isolating each deposition chamber from each adjacent deposition chamber.

Turning now to FIG. 2, a diagrammatic representation of a multiple glow discharge chamber deposition apparatus for the continuous production of the tandem photovoltaic cells, previously described, is generally illustrated by the reference numeral 26. The apparatus 26 includes a plurality of isolated, dedicated deposition chambers, each chamber being interconnected by a grooved, magnetic gas gate in accordance with the principles of the present invention.

The apparatus 26 is adapted to produce a high volume of large area, amorphous photovoltaic cells having a p-i-n configuration on the deposition surface of a substrate material 11 which is continually fed therethrough. To deposit the amorphous alloy layers required for producing a tandem cell of the p-i-n configuration, the apparatus 26 includes at least one triad of deposition chambers, each triad comprising: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough.

It should be apparent that: (1) although one triad of deposition chambers has been described, additional triads or additional individual chambers may be added to the machine to provide the machine with the capability of producing photovoltaic cells having any number of amorphous layers; (2) the grooved, magnetic gas gates of the present invention find application in an environment with as few as two adjacent chambers wherein prevention of backflow or cross-contamination of gases between those chambers is required; (3) although in the preferred embodiment, the substrate material is shown and described as a continuous web of magnetic material, the concept of the present invention may be adapted for depositing successive layers atop discrete magnetic substrate plates which can be continuously fed through the plurality of deposition chambers; (4) although not shown, other chambers (such as a chamber for adding a TCO layer atop the uppermost dopant layer of the photovoltaic device) may be operatively connected to the glow discharge apparatus 26 by the magnetic gas gate of the present invention; and (5) the substrate supply core 11a and the substrate take-up core 11b are shown in the deposition chambers for illustrative purposes only and in reality the cores would be rotatably positioned in separate chambers operatively connected to the deposition chambers.

Each deposition chamber 28, 30 and 32 of the triad is adapted to deposit a single amorphous silicon alloy, by glow discharge deposition onto the magnetic substrate 11. To that end, each of the deposition chambers 28, 30 and 32 includes: a cathode 34; a shield 35 disposed about three sides of each of the cathodes 34; a gas supply conduit 36; an inert sweep gas conduit 37 disposed on opposed sides of the intrinsic deposition chamber; a radio frequency generator 38; a plurality of transversing extending magnetic elements 39; a plurality of radiant heating elements shown schematically as 40 in FIG. 2; and a gas gate 42 operatively connecting each deposition chamber.

The supply conduits 36 are operatively associated with the respective cathodes 34 to deliver process gas mixtures to the plasma regions created in each deposition chamber 28, 30 and 32 between said cathodes 34, the cathode shield 35 and the substrate 11. The cathode shield 35 operate in conjunction with the web of substrate material 11 to substantially confine the plasma within the cathode region of the deposition chambers.

The radio frequency generators 38 operate in conjunction with the cathodes 34, the radiant heaters 40 and the grounded substrate 11 to form the plasma regions by dissociating the elemental reaction gases entering the deposition chambers 28,30 and 32 into deposition species. The deposition species are then deposited onto a surface of the substrate 11 as amorphous semiconductor layers. The substrate 11 is maintained substantially flat by the plurality of rows of magnetic elements 39 which provide an attractive force urging the substrate out of its normal sagging path of travel. In this manner, and as fully disclosed in copending and commonly assigned United States patent application entitled "Magnetic Apparatus For Reducing Substrate Warpage," uniform amorphous layers may be deposited onto said substrate.

To form the photovoltaic cell 10 illustrated in FIG. 1, a p-type amorphous silicon layer is deposited onto the substrate 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the substrate 11 wherein the intrinsic layer deposited in deposition chamber 30 differs in composition from the layers deposited in deposition chambers 28 and 32 by the absence of at least one element which will be referred to as the dopant or doping species.

It is important that each of the alloy layers (and particularly the intrinsic layer) deposited onto a surface of the magnetic substrate 11 be of high purity in order to produce high efficiency photovoltaic devices 10. It is therefore necessary to substantially prevent the back diffusion of dopant process gases into the intrinsic deposition chamber 30.

III. Magnetic Gas Gates Of The Prior Art

In an attempt to prevent back diffusion, thereby isolating the intrinsic process gases in the intrinsic deposition chamber 30 from the dopant process gases in the dopant deposition chambers 28 and 32, a unidirectional flow (in the direction of arrow 44) from the intrinsic deposition chamber 30 into either of the dopant deposition chambers 28 and 32 is established. As is readily apparent from FIG. 2, the intrinsic deposition chamber 30 is in operative communication with the dopant deposition chambers 28 and 32 by the gas gates which are illustrated as slots 42. The gas gates 42 are dimensioned to permit the substrate 11 to travel through a passageway 43 therein as the substrate continuously moves from the supply core 11a, through the deposition chambers 28, 30 and 32, and is wound onto the take-up core 11b. Initially, the dimensional height of the gas gate passageway 43 was selected to be as small as possible to prevent back diffusion of the dopant process gases, while still being sufficiently large for the substrate surface with the amorphous semiconductor layers deposited thereon, to pass therethrough without contacting and being scratched by the walls of the passageway 43. U.S. patent application Ser. No. 372,937, filed May 7, 1982 and entitled "Magnetic Gas Gate" was designed to provide a reduced passageway opening which would still permit contact-free passage of the layered substrate 11 therethrough while reducing back diffusion of process gases from the dopant deposition chambers 30 therethrough. The present invention is directed to an improved modification of the magnetic gas gate disclosed and described in detail in said patent application.

It should be noted that, although, this application relates predominantly to the prevention of contamination of the intrinsic semiconductor layer by dopant process gas constituents, the dopant semiconductor layers may also be protected from contamination by employing the grooved magnetic gas gate of the present invention to operatively connect the dopant deposition chambers and adjacent chambers in which, for instance, (1) a TCO layer is deposited atop the uppermost dopant layer, or (2) the magnetic substrate material is cleaned prior to entering the deposition chambers.

In order to prevent back diffusion of process gases from the intrinsic deposition chamber 30 to the dopant deposition chambers 28 and 32 through the gas gates 42, the p-dopant deposition chamber 28 and the n-dopant deposition chamber 32 are maintained at a lower internal pressure than the intrinsic deposition chamber 30. To that end, each deposition chamber may be provided with automatic throttle valves, pumps, and manometers (not illustrated). Each throttle valve is operatively connected to a respective deposition chamber and to a respective pump so as to evacuate excess and spent deposition constituents from the deposition chambers. Each absolute manometer is operatively connected to a respective deposition chamber and a respective one of the throttle valves for controlling the pressure within said deposition chambers. Hence, a constant pressure differential is established and maintained between adjacent chambers.

In the preferred embodiment, a sweep gas such as hydrogen, argon, or another inert gas is introduced at the intrinsic deposition chamber side of the gas gates 42. The sweep gas enters the intrinsic chamber 30 adjacent said gas gates 42 through conduits 37 which include apertures (not shown) for directing the inert sweep gas on both sides of the magnetic web of substrate material 11. Due to the pressure differential which has been established, the inert sweep gases unidirectionally move through the passageway 43 of the gas gates 42. The process gases for depositing the intrinsic layer are introduced into the intrinsic chamber 30 through conduit 36 and are substantially restricted to the plasma region of the chamber 30 by (1) the cathode shield 35 and (2) introducing and withdrawing these gases adjacent said region. In a like manner, the process gases for depositing the dopant layers are introduced into the dopant chambers 28 and 32 through conduits 36 and are also substantially restricted to the plasma regions of the dopant chambers by (1) the cathode shields 35 and (2) introducing and withdrawing those gases adjacent said regions. After the inert gases are swept through the gas gates 42 into the respective dopant deposition chambers, said inert gases may either be substantially withdrawn adjacent the dopant chamber side of the gas gates 42 or may be evacuated with the dopant process gases.

Figure 3:
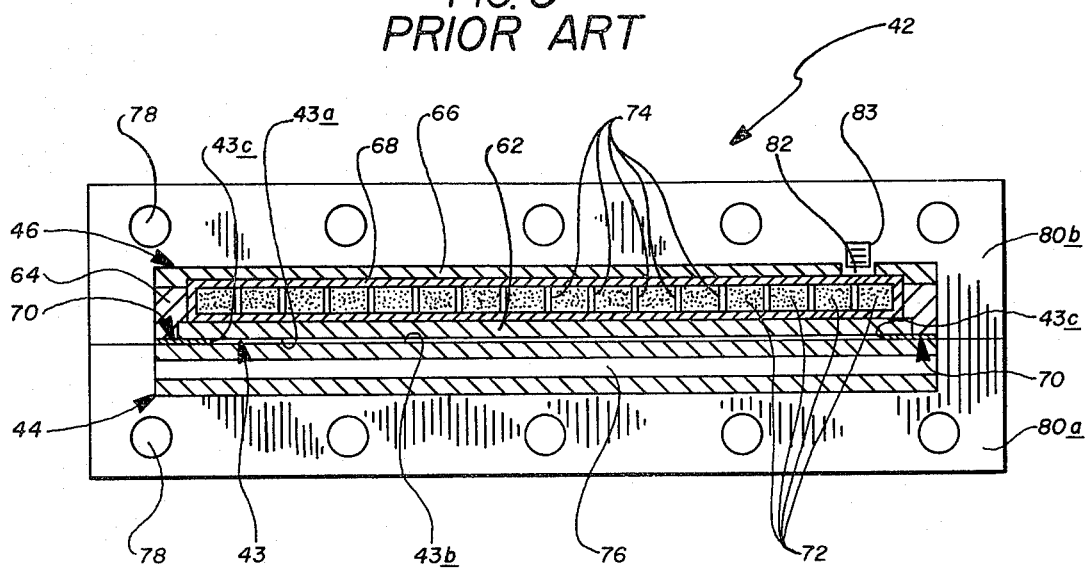
FIG. 3 is a cross-sectional view illustrating the arrangement of magnets and separators within a recess formed in the upper block of a typical magnetic gas gate of the prior art.
Figure 7:
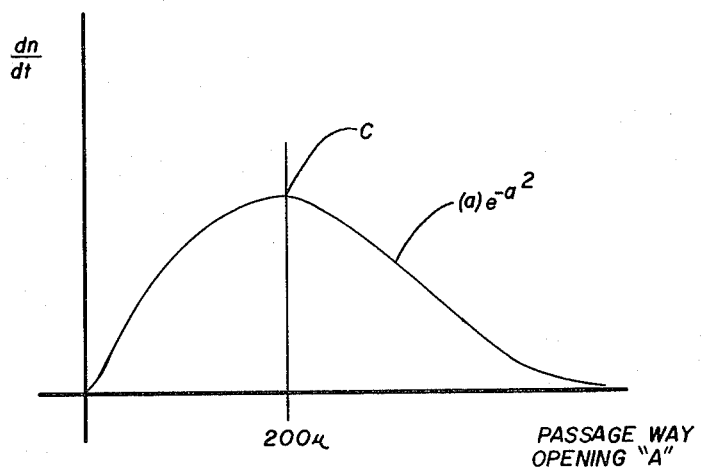
FIG. 7 is a graph of the number of molecules of dopant process gases per unit time (dn/dt) back diffusing into the intrinsic chamber versus the size of the gas gate passageway opening "a."

FIG. 3 is an enlarged cross-sectional view of the magnetic gas gate design of the prior art, indicated generally by the reference numberal 42. The gas gate 42 of FIG. 3 is intended to only generally represent the structural elements of the typical gas gate without depicting all of the well known nuts and bolts of such gas gates.

More particularly, the prior art gas gate 42 generally comprises a lower block 44 and an upper block 46. Secured to the leading edge of the upper block 46 can be a transversely elongated cylindrical roller assembly (not shown) for guiding the magnetic web of substrate material 11 through a relatively narrow passageway 43 formed between the top surface of the lower gas gate block 44 and a cut-out portion of the upper gas gate block 46. It is through this passageway 43 that the unidirectional flow of the inert sweep gas from the intrinsic deposition chamber into the adjacent dopant deposition chambers is established.

The gas gate passageway 43 of prior art devices is generally rectangular in cross-sectional configuration and is defined by an upper wall 43a, an opposed lower wall 43b and opposed side walls 43c. As previously mentioned, it is desirable that the height of the side walls 43c be minimized to correspondingly minimize the back diffusion of gases through the passageway 43. To accomplish that objective, the upper wall 43a of the passageway 43 is fabricated from a tempered glass sheet 62 such as "PYREX" (registered trademark of Corning Glass Works for a borosilicate glass having a softening temperature of 820° C., an upper working temperature in normal service of 230° C. and a scleroscope hardness of 120).

The passageway 43 is partially formed by a recess 64 in the upper block 46 into which is secured the magnetically attractive assembly which is adapted to urge the magnetic substrate 11 into sliding contact with the lower surface of the glass sheet 62. More particularly, an aluminum plate 66, a stainless steel enclosure 68 and the glass plate 62 are successively placed into the recess 64. A pair of elongated, relatively thin spacers 70 (1) form the side walls 43c of the passageway 43, and (2) fix the height of the passageway opening. Although the preferred height of the spacers is one-eighth (⅛) inch, the height dimension has, in practice, been reduced to a value as small as one-sixteenth (1/16) inch. As the size of the passageway opening is decreased, the amount of dopant gases back diffusing through the passageway 43 from the dopant deposition chambers 28 and 32 is correspondingly reduced. The decrease in the passageway opening from the previous one-quarter inch dimension to the one-sixteenth inch value, which is made possible by the use of magnetic gas gates, resulted in a decrease of back diffusion by at least a factor of one-hundred (100).

Inside the stainless steel enclosure 68, a plurality of one (1) inch wide by two (2) inch long ceramic magnets 72 are arranged in rows and columns by a plurality of horizontally and vertically arranged magnet separators 74. The magnets 72 are preferably fashioned from ceramic material although other magnetic materials may be used. It is preferable that a plurality of bar magnets be used to create the total magnetic field. This is because the greatest magnetic flux is developed at the ends of the bar magnets 72 and therefore the more magnets used, the greater the attractive force and the more uniform the magnetic field.

The magnetic separators 74 are substantially flat, elongated, non-magnetic elements, such as one-sixteenth (1/16) inch thick aluminum plates. The separators 74 cooperate with the plurality of magnets 72 to enhance the uniformity of the magnetic field. In the preferred embodiment, a total of sixty-four (64) one (1) inch by two (2) inch ceramic magnets 72 are so spaced by non-magnetic separators 74 that the ends of the peripheral magnets 72 terminate coincidentally with the edge of the magnetic web of substrate material 11 traveling through the passageway 43. By so arranging the magnets 72 relative to the magnetic substrate 11, the established magnetic field also centers the substrate 11 as it travels through the gas gate 42. The upper block 46 includes a two-piece retainer (not shown) for holding the magnets 72 and separators 74 in the prearranged pattern.

The top surface of the lower block 44 of the gas gate 42 forms the lower wall 43b of the passageway 43. Both the lower block 44 and the upper block 46 of the gas gate 42 include a plurality of apertures 78 in panels 80a and 80b, respectively, for mounting the gas gate 42 between adjacent deposition chambers. Further, a port 82 provides access into the upper block 64 and the aluminum plate 66 for establishing communication with the recess 64. In this manner, the recess 64 can be pumped after the magnetic gas gate apparatus is inserted thereinto and the port 82 can be sealed by plug 83 to prevent contamination of the deposition chambers.

The magnetic field developed by the ceramic magnets 72 urges the unlayered side of the magnetic web of substrate material 11 (fabricated from a material such as 430 stainless steel) traveling through the passageway 43 in the gas gate 42 into sliding contact with the surface of the upper wall 43a. The ceramic magnets 72 develop a uniform magnetic field with very strong forces in a direction perpendicular to the planar surface of the substrate 11 traveling through the passageway 43, but relatively weak forces in a direction parallel to said planar substrate surface. The magnetic web of substrate material 11 is thereby simultaneously (1) urged toward the surface of the upper passageway wall 43a, while (2) enjoying the ability to slide relatively freely thereagainst as it passes through the passageway 43.

IV. The Grooved, Magnetic Gas Gate

The magnetic field established by urging the magnetic substrate 11 into sliding contact with the upper wall 43a of the passageway 43, provided for a reduction in the size of the passageway opening without requiring special tolerances to prevent scratching of the unlayered substrate surface. And, as the width of the passageway opening was reduced, the total amount of back diffusion of dopant process gases was correspondingly reduced, thereby substantially decreasing contamination of the intrinsic layer and producing a more efficient photovoltaic device. However, as previously explained, while the total back diffusion decreased, the back diffusion between the upper passageway wall and the unlayered substrate surface increased. The remainder of this detailed disclosure concerns a description of the modifications of the magnetic gas gate which result in reduced back diffusion between said upper passageway wall and unlayered substrate surface.

Figure 6:
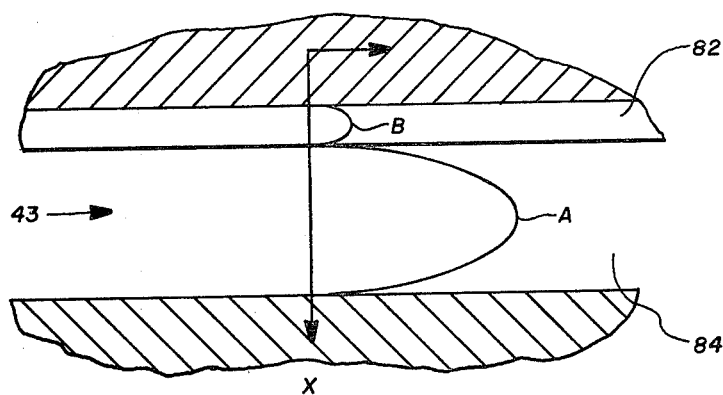
FIG. 6 is a greatly enlarged, fragmentary view of the relatively narrow upper slit and the relatively wide lower slit into which the passageway of prior art magnetic gas gates are divided by a web of substrate material and the relative velocity profiles achieved in each of those slits.

As previously described with reference to FIG. 6, the web of substrate material 11 divides the magnetic gas gate passageway opening 43 into a relatively narrow upper slit 82 and a relatively wide lower slit 84. It is in the relatively narrow upper slit 82 that the viscous sweep gases are unable to attain sufficient velocity to prevent back diffusion of dopant gases from the dopant chambers 28 and 32 into the intrinsic chamber 30 (see FIG. 2).

Figure 4:
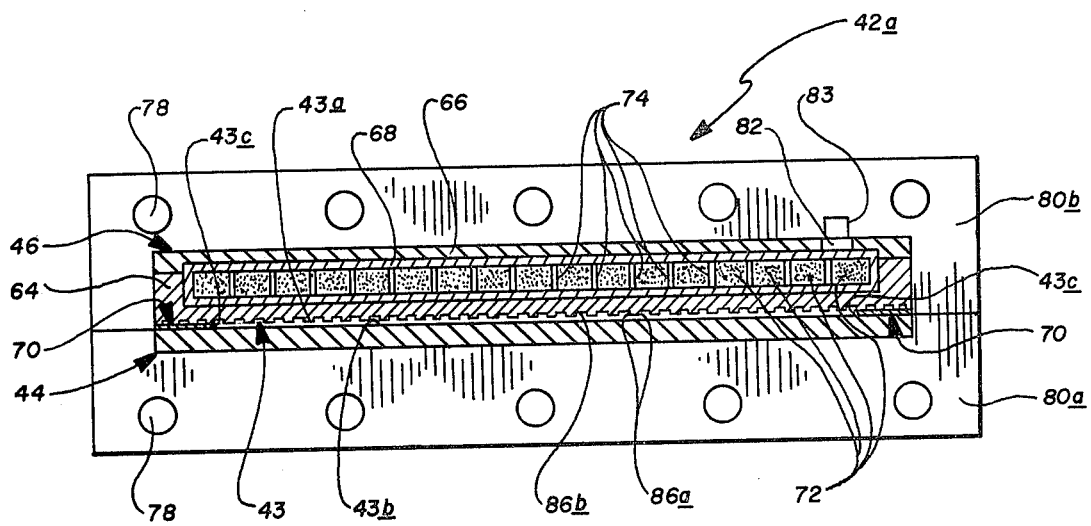
FIG. 4 is an enlarged cross-sectional view taken along line 4—4 of FIG. 2 illustrating the disposition of magnetic elements relative to the grooved flow channels formed, in accordance with the basic principles of the present invention, in the upper block of the gas gate.
Figure 5:
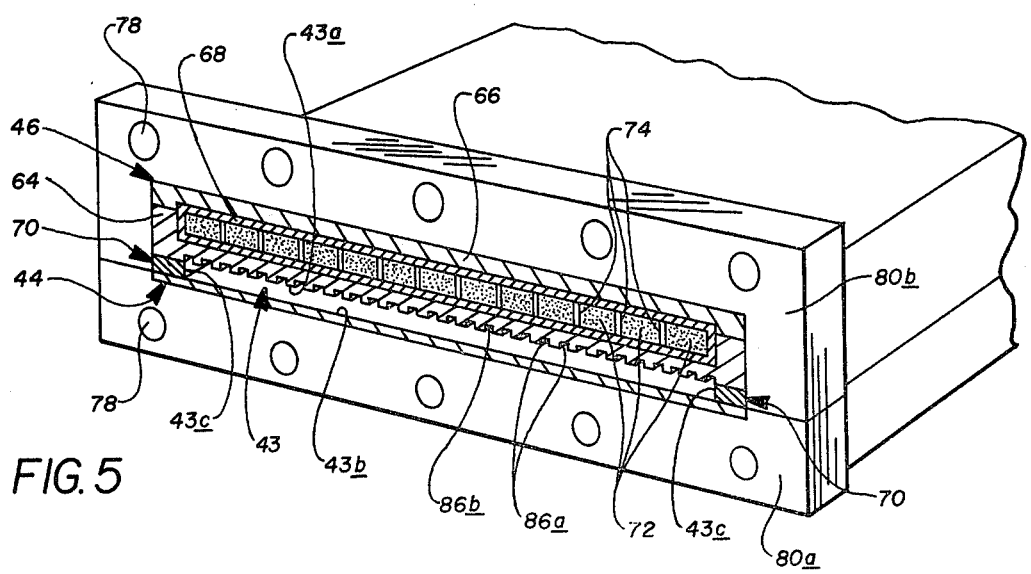
FIG. 5 is an enlarged, fragmentary perspective view of the magnetic, grooved gas gate of the present invention.

Referring now to FIGS. 4 and 5, like numerals refer to common elements of the prior art magnetic gas gate 42 and the improved, grooved gas gate of the present invention 42a. The gas gate 42a of the present invention is shown to include a passageway 43 of generally rectangular cross-sectional configuration. The gas gate passageway 43 is defined by an upper wall 43a, a lower wall 43b opposite the upper wall, and opposed side walls 43c. The passageway 43 is partially formed by a recess 64 in the upper block 46 of the gas gate 42a into which is secured the magnetically attractive assembly adapted to urge the substrate into sliding contact with the upper gas gate passageway wall 43a. More particularly, an aluminum plate 66 and a stainless steel enclosure 68 are successively placed into the recess 64. A pair of elongated, relatively thin spacers 70 operate to both form the side walls 43c of the passageway 43 and fix the size of the passageway opening. As with the prior art magnetic gas gate; the preferred height of the spacers is ⅛ inch although the value can be as small as 1/16 inch; inside the stainless steel enclosure 68, a plurality of ceramic magnetics 72 are arranged in a plurality of rows and columns by a plurality of substantially flat, elongated, non-magnetic separators 74; the top surface of the lower block 44 of the gas gate 42a forms the lower wall 43b of the passageway 43; both the lower block 44 and the upper block 46 include a plurality of apertures 78 on attachment plates 80a and 80b, respectively, for mounting the gas gate 42 between adjacent deposition chambers; and a port 82 provides access into the upper block 64 and the aluminum plate 66 for establishing communication with the recess 64.

In order for the inherently viscous inert gases to be swept through the relatively narrow, upper slit 82 between the web of substrate material and the upper wall 43a of the gas gate passageway 43 with sufficient velocity to prevent the back diffusion of process gases from the dopant chambers into the intrinsic chamber, the upper wall 43a of the passageway 43 has been formed with a plurality of elongated, generally parallel grooves 86 therein. The grooves 86 extend the entire approximately eight (8) inch length of the gas gate passageway 43 so as to operatively communicate at one end with the dopant deposition chamber and at the other end with the intrinsic deposition chamber. In this manner, the gases swept through the flow channels defined by the grooves 86 sense the constant pressure differential between the adjacent deposition chambers to establish unidirectional flow through the gas gate. Each of the parallel grooves 86 is defined by opposed side walls 86a and an upper wall 86b. The unlayered surface of the web of substrate material 11 is urged against the upper, one-eighth inch wide passageway walls 43a which are defined as the surfaces formed between adjacent grooves 86. The side walls 86a extend downwardly approximately one-eighth ($\frac{1}{8}$) inch and are separated by the upper wall 86b which is about one-quarter ($\frac{1}{4}$) inch wide, thereby providing a plurality of one-eighth inch high and one-quarter inch wide flow channels between deposition chambers. Since the flow channels are significantly greater than 200 microns (the point of maximum back diffusion), the velocity of gases therethrough is approximately equal to the velocity of gases flowing through the lower slit 84. Therefore, the one-quarter inch passageway opening provided above the substrate, permits only minimal back diffusion of process gases from the dopant deposition chamber to the intrinsic deposition chamber.

It should be appreciated that the molecules of gases flowing through the upper slit 82 may either travel through the flow channels defined by the grooves 86 or through the relatively narrow space between adjacent grooves 86. The inert gases flowing through the grooves 86 are able to attain sufficient velocity to substantially prevent back diffusion of process gases. The inert gases flowing through the relatively narrow space between grooves are not able to attain sufficient velocity. However, due to the eight inch long path which the dopant process gases must traverse to back diffuse into the intrinsic chamber, it is improbable that the dopant gases will complete the journey to the intrinsic chamber without entering the high velocity flow channel grooves. Once in the high velocity channels, those dopant process gases will move with the flow of the inert sweep gases and be returned to the dopant chamber. In this manner, contamination of the intrinsic chamber caused by dopant process gases back diffusing through the upper passageway slit 82 has been substantially reduced by the instant invention.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

We claim:

1. In a gas gate which includes a relatively narrow passageway adapted to (1) operatively interconnect a pair of adjacent deposition chambers and (2) substantially reduce the back diffusion of gases from the first of the pair of chambers to the second of the pair of chambers; a relatively thin, relatively large area substrate adapted to travel from one of the pair of chambers wherein a first layer is deposited onto a surface thereof, and into the other of the pair of chambers wherein a second layer is deposited atop the first layer; means adapted to introduce at least one gas into the first of the pair of chambers; means adapted to introduce at least one additional gas into the second of the pair of chambers; gas removing means for establishing a pressure differential between the adjacent chambers whereby the gas flow therebetween is substantially unidirectional; and means for urging the unlayered surface of the substrate toward a passageway wall; the improvement comprising, in combination:

at least one elongated groove formed in the passageway wall toward which the unlayered surface of the substrate is urged, said groove being substantially coextensive with the length of the passageway so as to operatively interconnect the adjacent chambers, whereby a substantially unidirectional gas flow is established through the slit defined by the space between the gas gate passageway wall and the unlayered surface of the substrate for substantially reducing the backflow of gases from the first to the second of the chambers.

2. Apparatus as in claim 1, wherein a plurality of spaced, elongated grooves are formed in the passageway wall toward which the unlayered surface of the substrate is urged.

3. Apparatus as in claim 2, wherein each of the plurality of elongated grooves are spaced in parallel arrangement so as to define a plurality of parallel slits.

* * * * *